United States Patent
Kang et al.

(10) Patent No.: US 10,161,590 B2
(45) Date of Patent: Dec. 25, 2018

(54) EXTERIOR LIGHT EMITTING DIODE PACKAGE FOR VEHICLE

(71) Applicants: Hyundai Motor Company, Seoul (KR); Kia Motors Corporation, Seoul (KR)

(72) Inventors: Chan Hee Kang, Bucheon-si (KR); Kwang Jin Park, Incheon (KR); Kyung Ill Won, Bucheon-si (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 0 days.

(21) Appl. No.: 15/676,760

(22) Filed: Aug. 14, 2017

(65) Prior Publication Data

US 2018/0266649 A1 Sep. 20, 2018

(30) Foreign Application Priority Data

Mar. 14, 2017 (KR) .................. 10-2017-0032050

(51) Int. Cl.
| | |
|---|---|
| *F21S 45/10* | (2018.01) |
| *H01L 33/48* | (2010.01) |
| *H01L 33/50* | (2010.01) |
| *H01L 33/58* | (2010.01) |
| *H01L 33/60* | (2010.01) |
| *H01L 33/62* | (2010.01) |
| *H01L 33/64* | (2010.01) |
| *F21Y 115/10* | (2016.01) |

(52) U.S. Cl.
CPC ............ *F21S 45/10* (2018.01); *H01L 33/486* (2013.01); *H01L 33/502* (2013.01); *H01L 33/58* (2013.01); *H01L 33/60* (2013.01); *H01L 33/62* (2013.01); *H01L 33/647* (2013.01); *F21Y 2115/10* (2016.08)

(58) Field of Classification Search
CPC .......................... H01L 33/62; B29C 45/14655
See application file for complete search history.

(56) References Cited

U.S. PATENT DOCUMENTS

| | | | |
|---|---|---|---|
| 2011/0272716 A1* | 11/2011 | Lee .......................... | H01L 33/62 257/88 |
| 2012/0012879 A1* | 1/2012 | Loh ........................ | H01L 33/483 257/98 |
| 2015/0228873 A1* | 8/2015 | Gebuhr ................... | H01L 24/32 257/99 |
| 2016/0308102 A1* | 10/2016 | Zitzlsperger ............ | H01L 33/62 |

* cited by examiner

*Primary Examiner* — Sitaramarao S Yechuri
(74) *Attorney, Agent, or Firm* — Morgan, Lewis & Bockius LLP

(57) ABSTRACT

An external light emitting diode package for a vehicle, may include an LED chip; a lead frame which includes a substrate which includes conductive metal and to which one or more LED chips are bonded, and a lead pad which is distanced from the substrate and electrically connected to the LED chip; a mold which is formed on the lead frame and includes a dam that forms a cavity in a region of the substrate where the LED chip is bonded; and a lens which is bonded to the mold, such that the cavity is designed in the mold in an optimum state and the mold and the lens are tightly attached to each other, improving adhesive strength, and the substrate, which is coupled to a mold, includes conductive metal, improving thermal conductivity and surface roughness of the substrate.

15 Claims, 13 Drawing Sheets

(a)

(b)

EXTERIOR LIGHT EMITTING DIODE PACKAGE FOR VEHICLE

CROSS-REFERENCE TO RELATED APPLICATION

The present application claims priority to Korean Patent Application No. 10-2017-0032050 filed on Mar. 14, 2017, the entire contents of which is incorporated herein for all purposes by this reference.

BACKGROUND OF THE INVENTION

Field of the Invention

The present invention discloses a light emitting diode package used for various types of lamps for a vehicle.

Description of Related Art

In general, a light emitting diode (LED) constitutes a light emitting source by changing compound semiconductor materials. The LED refers to a semiconductor element capable of implementing light having various colors.

The advantage of the LED is that the LED has an excellent monochromatic peak wavelength and excellent luminous efficiency, and the LED may be compact. Therefore, the LED is mainly configured in the form of a package and widely used for various display devices and various light sources. In particular, the LED is being actively developed as a high-efficiency and high-output light source that may be substituted for a backlight of a lighting device and a display device.

A light emitting diode package in the related art includes a lead frame, a mold, and a lens.

The lead frame includes a substrate to which a LED chip is bonded, and a lead pad which is distanced from the substrate and electrically connected to the LED chip. The mold is an opaque resin that surrounds the lead frame in order to fix the lead frame. The lens is a transparent resin that is bonded to the mold in order to protect electronic components including the LED chip.

However, the light emitting diode package in the related art cannot be sufficiently used for an exterior lamp of a vehicle because it is difficult to increase bonding force among the mold, the substrate, and the lens. The exterior lamp is required to have high durability because the vehicle is exposed to vibration and an extreme outdoor environment. In a case in which internal bonding of the light emitting diode package is not properly performed, moisture or the like penetrates into the light emitting diode package, which causes an operational defect or deterioration in lifespan.

In addition, a ceramic material (aluminum nitride and alumina-based material) having high heat resistance and high heat radiation characteristics is used as a substrate material for a package in the related art. The substrate has a sandwich structure of a ceramic plate and a copper (Cu) plate, and has a disadvantage in terms of heat resistance because an air layer exists between the ceramic plate and the copper plate depending on compression quality. The substrate also has a disadvantage in that surface roughness of the ceramic plate is poor.

Therefore, it is difficult to satisfy a required level in a case in which the light emitting diode package in the related art is applied to a light source for a vehicle.

The information disclosed in this Background of the Invention section is only for enhancement of understanding of the general background of the invention and may not be taken as an acknowledgement or any form of suggestion that this information forms the prior art already known to a person skilled in the art.

BRIEF SUMMARY

Various aspects of the present invention are directed to providing an external light emitting diode package for a vehicle in which a cavity is designed in a mold in an optimum state, and the mold and a lens are tightly attached to each other, improving adhesive strength.

The present invention, in various aspects, has also been made in an effort to provide an external light emitting diode package for a vehicle in which a substrate, which is coupled to a mold, includes conductive metal, improving thermal conductivity and surface roughness of the substrate.

Various aspects of the present invention are directed to providing an external light emitting diode package for a vehicle, including: an LED chip; a lead frame which includes a substrate which includes conductive metal and to which one or more LED chips are bonded, and a lead pad which is distanced from the substrate and electrically connected to the LED chip; a mold which is formed on the lead frame and includes a dam that forms a cavity in a region of the substrate where the LED chip is bonded; and a lens which is bonded to the mold.

The mold may be formed by an injection molding process using a non-conductive epoxy mold compound.

A stepped portion may be formed at a portion of the substrate which is bonded to the mold.

The stepped portion of the substrate may be formed by any one of etching and stamping processes.

The substrate and the mold may be bonded to each other while forming the stepped portion.

The mold may have a catching projection which is formed at a bonding portion with the substrate and abuts against the stepped portion of the substrate.

The substrate may include a conductive metal material.

The conductive metal material may be copper or aluminum.

The mold may further include one or more external peripheral cavities which are formed to be depressed along a periphery of the cavity.

The external peripheral cavities may further include edge cavities which are formed to be depressed at one or more edge portions among external peripheral edge portions based on the LED chip.

The external peripheral cavities may further include lateral cavities which are formed to be depressed at one or more lateral sides along the lateral sides based on the LED chip.

The mold may have an assembly groove which is formed in a space between the edge portion cavities.

An inclined surface may be formed at one side of the edge portion cavity.

A fluorescent film may be applied to a portion of the substrate to which the LED chip is attached.

A depth of the edge portion cavity may be 100 to 300 μm.

A height of the dam may range from 100 to 300 μm.

The external peripheral cavity may be formed in a geometric shape including a circular shape, a square shape, and a rhombic shape.

According to the light emitting diode package, the cavity is designed in the mold to have an optimum depth, such that adhesive strength of the lens attached to the substrate may be improved. The plurality of cavities having various shapes is formed in the mold, increasing a bonding area between the mold and the lens. Adhesive strength between the components of the light emitting diode package is improved, improving reliability of a product.

In addition, the substrate to which the LED chip is bonded includes conductive metal, such that thermal conductivity the substrate is improved, improving heat radiation performance of a product. With the substrate made of conductive metal, it is possible to improve surface roughness and reliability of an LED lamp.

The methods and apparatuses of the present invention have other features and advantages which will be apparent from or are set forth in more detail in the accompanying drawings, which are incorporated herein, and the following Detailed Description, which together serve to explain certain principles of the present invention.

Figure 1:
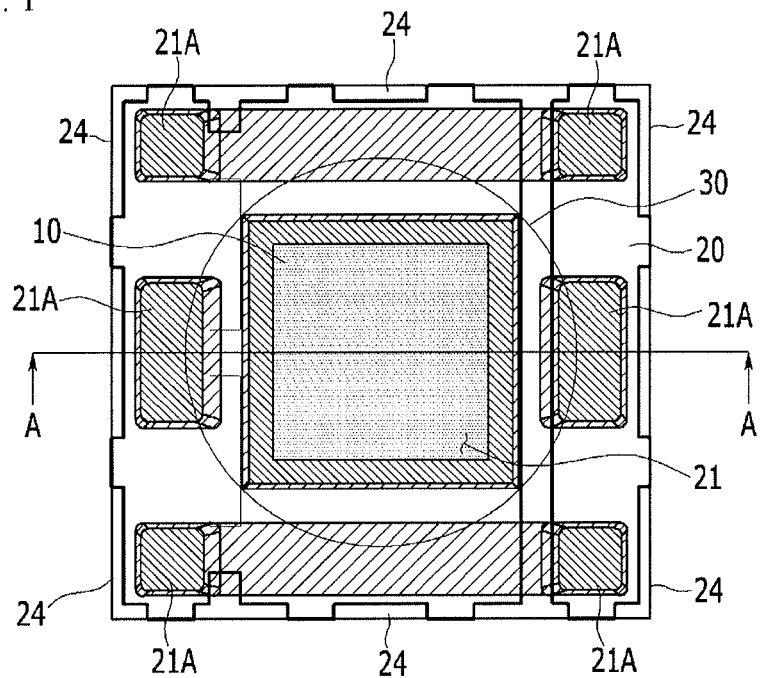
FIG. 1 is a view schematically illustrating a structure of an external light emitting diode package for a vehicle according to the present exemplary embodiment.
Figure 1:
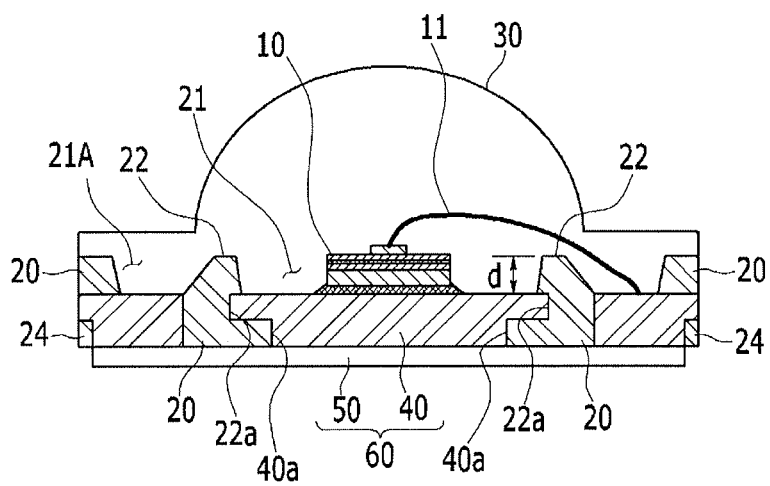

It may be understood that the appended drawings are not necessarily to scale, presenting a somewhat simplified representation of various features illustrative of the basic principles of the invention. The specific design features of the present invention as disclosed herein, including, for example, specific dimensions, orientations, locations, and shapes will be determined in part by the particularly intended application and use environment.

In the figures, reference numbers refer to the same or equivalent parts of the present invention throughout the several figures of the drawing.

DETAILED DESCRIPTION

Reference will now be made in detail to various embodiments of the present invention(s), examples of which are illustrated in the accompanying drawings and described below. While the invention(s) will be described in conjunction with exemplary embodiments, it will be understood that the present description is not intended to limit the invention(s) to those exemplary embodiments. On the contrary, the invention(s) is/are intended to cover not only the exemplary embodiments, but also various alternatives, modifications, equivalents and other embodiments, which may be included within the spirit and scope of the invention as defined by the appended claims.

The technical terms used herein are merely for the purpose of describing a specific exemplary embodiment, and not intended to limit the present invention. Singular expressions used herein include plural expressions unless they have definitely opposite meanings. The terms "comprises" and/or "comprising" used in the specification specify particular features, regions, integers, steps, operations, elements, components, but do not preclude the presence or addition of other particular features, regions integers, steps, operations, elements, components, and/or groups thereof.

Hereinafter, exemplary embodiments of the present invention will be described in detail with reference to the accompanying drawings so that those skilled in the art to which the present invention pertains may easily carry out the exemplary embodiments. It can be easily understood by those skilled in the art to which the present invention pertains that the following exemplary embodiments may be modified to various forms without departing from the concept and the scope of the present invention. Therefore, the present invention can be implemented in various different forms, and is not limited to the exemplary embodiments described herein.

FIG. 1 is a view schematically illustrating a structure of an external light emitting diode package for a vehicle according to the present exemplary embodiment. FIG. 1B is a cross-sectional view taken along line A-A in FIG. 1A.

FIG. 1 illustrates a light emitting diode package used for an external lamp for a vehicle.

In the exemplary embodiment of the present invention, the external light emitting diode package for a vehicle includes an LED chip 10, a lead frame 60, a mold 20, and a lens 30.

The LED chip is a light emitting diode element using properties of a compound semiconductor, and the LED chip is a semiconductor chip that generates light by applying electric current.

The lead frame 60 may include a substrate 40 which includes conductive metal and to which at least one LED chip 10 is bonded, and a lead pad 50 which is distanced from the substrate 40 and electrically connected to the LED chip 10.

The mold 20 may include a dam 22 which is formed on the lead frame 60 and forms a cavity 21 in a region of the substrate 40 where the LED chip 10 is bonded. The mold 20 includes the cavity 21 having a predetermined depth. That is, the dam 22 is formed on the substrate 40 around the LED chip 10 such that the cavity 21 surrounded by the dam 22 is formed. In the exemplary embodiment of the present invention, the mold 20 may include an opaque resin.

The lens 30 includes a transparent silicone resin bonded to the mold 20. The lens 30 is bonded to the LED chip 10 on the substrate 40 and protects the components.

That is, the light emitting diode package has the mold 20 which is formed to surround and fix the lead frame including the substrate 40. The LED chip 10 is attached to the substrate 40, and a plurality of electronic components is connected to the substrate 40.

Therefore, the mold 20 has the cavity 21, such that a bonding area with the lens 30 attached to the substrate 40 is increased. In addition, the mold and the lens have an uneven bonding surface because of the cavity. For the present reason, bonding strength between the substrate 40 and the lens 30 is improved. A depth of the cavity 21 may be 100 to 300 μm.

In addition, the substrate 40 includes conductive metal, improving heat radiation performance of the light emitting diode package. The substrate 40 made of conductive metal may improve surface roughness thereof.

Further, the mold 20 may be formed by an injection molding process using a non-conductive epoxy mold compound. To form the cavity 21, the mold 20 may be processed by injection-molding a non-conductive opaque resin. The mold 20 may include a resin with high reflectance to increase surface reflection efficiency of the mold 20.

In the exemplary embodiment of the present invention, the substrate 40 may have a stepped portion 40a formed at a portion where the mold 20 is bonded. The stepped portion 40a of the substrate 40 may be formed by any one of etching and stamping processes. Therefore, the substrate 40 and the mold 20 may be bonded to each other while forming the stepped portion. The mold 20 may have a catching projection 22a which is formed at the bonding portion with the substrate 40 and abuts against the stepped portion 40a of the substrate 40.

That is, when the mold 20 is bonded, by a molding process, to the substrate 40 having the stepped portion 40a, the catching projection 22a may be formed while the mold 20 is bonded to the stepped portion 40a of the substrate 40. Therefore, the substrate 40 and the mold 20 are coupled to each other in a stair shape in a stepped manner.

Therefore, gas-tightness between the substrate 40 and the mold 20 is maintained, and adhesive force between the substrate 40 and the mold 20 may be improved. Moisture hardly penetrates between the substrate 40 and the mold 20, and as a result, product reliability may be improved.

In the exemplary embodiment of the present invention, the mold 20 may further include one or more external peripheral cavities 21A which are formed to be depressed along the periphery of the cavity 21. The mold 20 may have molding portions 24 which are formed at an edge portion and a rim bonded to the substrate 40. The molding portions 24 surround the external periphery of the lead frame including the substrate 40, improving gas-tightness between the components.

Meanwhile, the substrate 40 may include a copper material. The substrate 40, which includes copper, that is, conductive metal, may improve resistance against thermal shock. With the copper substrate with improved thermal conductivity, it is possible to improve heat radiation performance of an LED product. The substrate 40 may also include an aluminum material.

That is, in the light emitting diode package, the mold 20 may be formed by molding epoxy having high heat resistance performance, and the substrate 40 may include a copper material having high heat radiation performance.

Therefore, it is possible to increase thermal conductivity of the substrate 40 and improve durability of the mold 20.

Figure 2:
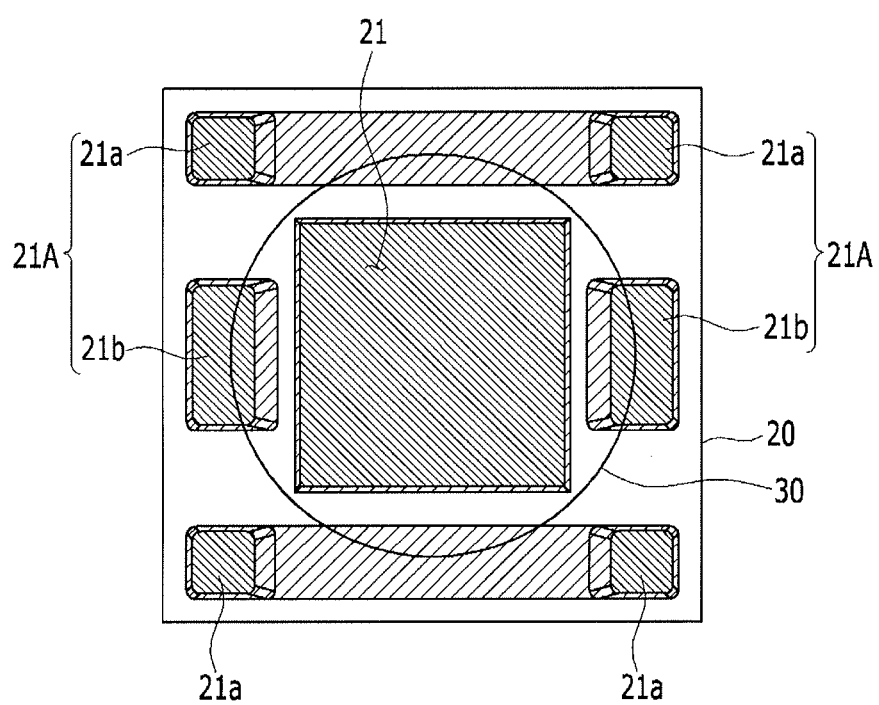
FIG. 2 is a view schematically illustrating the light emitting diode package according to the present exemplary embodiment in a plan view.

FIG. 2 is a view schematically illustrating the light emitting diode package according to the present exemplary embodiment in a plan view.

As illustrated in FIG. 2, a plurality of cavities having various shapes may be formed in the mold 20 in addition to the cavity 21.

In the exemplary embodiment of the present invention, the mold 20 may further include one or more external peripheral cavities 21A which are formed to be depressed along the periphery of the cavity 21.

The external peripheral cavities 21A may further include edge cavities 21a which are formed to be depressed at one or more edge portions among external peripheral edge portions based on the LED chip 10. The external peripheral cavities 21A may further include lateral cavities 21b which are formed to be depressed at one or more lateral sides along the lateral sides based on the LED chip 10.

That is, the cavity 21 for protecting the LED chip 10 may be formed at the center of the mold 20, and the external peripheral cavities 21A may be formed to be disposed at the external periphery of the mold 20 based on the LED chip 10. The external peripheral cavities 21A may be classified into the edge cavities 21a and the lateral cavities 21b.

The cavity 21, the edge cavities 21a, and the lateral cavities 21b may be designed to have an equal depth.

A depth of the edge portion cavity 21a may be 100 to 300 μm.

The edge portion cavity 21a may be formed to prevent the mold 20 from being thermally deformed. The deformation of the mold 20, which is contracted by heat, may be minimized by the edge portion cavity 21a. Therefore, it is possible to ensure reliability of the mold 20 against thermal shock.

Figure 3:
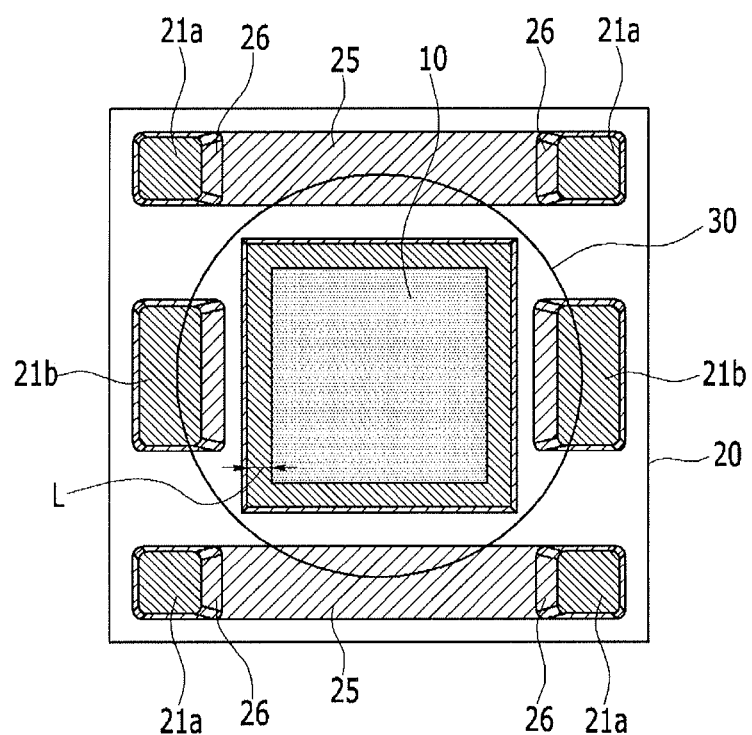
FIG. 3 is a view schematically illustrating a design state of the light emitting diode package according to the present exemplary embodiment.

FIG. 3 is a view schematically illustrating a particular design state of the light emitting diode package according to the present exemplary embodiment.

As illustrated in FIG. 3, the mold 20 may have assembly grooves 25 which are formed in a space between the edge cavities 21a. An inclined surface 26 may be formed at one side of each of the edge cavities 21a.

A wire 11 for electrically connecting the components attached to the substrate 40 may be accommodated in the assembly groove 25 of the mold 20. The wire 11 may be guided to the edge portion cavity 21a by the inclined surface 26 formed at one side of the edge portion cavity 21a.

That is, in a state in which the wire 11 is accommodated in the assembly groove 25, an end portion of the wire 11 may be inserted through the inclined surface 26 formed at one side of the edge portion cavity 21a. Therefore, it is possible to more effectively fix the wire 11 connected to a static electricity protection element. The end portion of the wire 11, which is configured to be inserted into the edge portion cavity 21a, may be more easily guided by the inclined surface 26.

The assembly groove 25 may be processed to have a depth of 50 to 100 μm. When a depth of the assembly groove 25 is smaller than 50 μm, the assembly groove 25 is shallow, and as a result, it is difficult to fix the wire 11. When a depth of the assembly groove 25 exceeds 100 μm and thus the substrate is exposed, the substrate 40 at a lower side and the wire 11 may cause a short circuit.

In addition, when designing the light emitting diode package, a distance L between the LED chip 10 and the dam 22 may be maintained to be 150 to 350 μm. The present distance may be an appropriate distance of the dam 22 for protecting the LED chip 10. When a distance between the LED chip 10 and the dam 22 is smaller or larger by departing from the range, there may be a problem in terms of bonding strength when bonding the mold 20 and the lens 30.

In the exemplary embodiment of the present invention, a fluorescent film may be applied to a portion of the substrate 40 to which the LED chip 10 is attached. The fluorescent film may be applied to the LED chip 10 and the substrate 40 by use of a dispensing process. The mold 20 and the lens 30 are bonded by forming the lens 30 by use of a silicone transparent resin after applying the fluorescent film.

Figure 4:
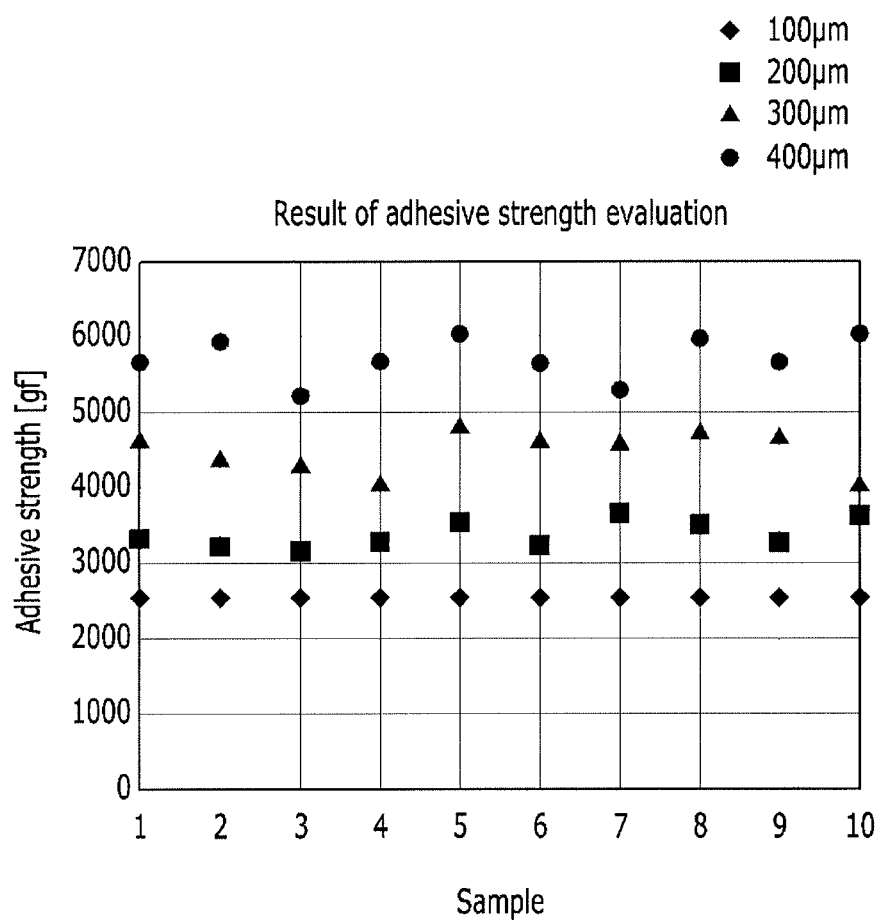
FIG. 4 is a graph illustrating evaluation of adhesive strength with other members in accordance with cavity depths of the light emitting diode package according to the present exemplary embodiment.

FIG. 4 is a graph illustrating evaluation of adhesive strength with other members in accordance with cavity depths of the light emitting diode package according to the present exemplary embodiment.

FIG. 4 illustrates a result of evaluating adhesive strength between the substrate 40 and the mold 20 by optimizing a depth of the edge portion cavity, and a depth of the edge portion cavity 21a may be 100 to 300 μm.

When a depth of the edge portion cavity 21a is greater than 300 μm, air may be introduced into the edge portion cavity 21a, and a forming defect rate is increased.

When a depth of the edge portion cavity 21a is smaller than 100 μm, an adhesive strength between the substrate 40 and molded epoxy, which forms the mold 20, deteriorates.

Therefore, a depth of the edge portion cavity 21a may be designed to be 100 to 300 μm in consideration of a reliability influence, formability, and adhesive strength when assembling the components.

To verify a significant difference in accordance with a depth of the edge portion cavity 21a, a result of evaluating adhesive strength in accordance with a depth is shown in Table 1.

TABLE 1

| Sample | 50 μm | 100 μm | 300 μm | 400 μm |
|---|---|---|---|---|
| #1 | 2931 | 3327 | 4647 | 5667 |
| #2 | 2934 | 3223 | 4384 | 5923 |
| #3 | 2556 | 3168 | 4311 | 5207 |
| #4 | 2733 | 3278 | 4071 | 5675 |
| #5 | 2573 | 3546 | 4819 | 6036 |
| #6 | 3027 | 3244 | 4656 | 5637 |
| #7 | 3056 | 3657 | 4611 | 5295 |
| #8 | 2769 | 3504 | 4738 | 5981 |
| #9 | 2812 | 3264 | 4678 | 5656 |
| #10 | 2659 | 3635 | 4049 | 6034 |
| Min | 2556 | 3168 | 4049 | 5207 |
| Avg | 2805 | 3385 | 4496 | 5711 |
| Max | 3056 | 3657 | 4819 | 6036 |
| Stdev | 179 | 182 | 276 | 292 |

Table 1 shows the numerical conversion of a result of evaluating adhesive strength in FIG. 4.

As shown in Table 1, it can be seen that the adhesive strength is lower when a depth is 50 μm than when a depth is 100 μm. It can be seen that the adhesive strength is higher when a depth is 400 μm than when a depth is 300 μm.

The adhesive strength may be increased as the depth of the edge portion cavity 21a is increased as described above, but when the depth exceeds 300 μm and is 400 μm, there may be a problem in terms of formability of the lens.

In a case in which a resin for forming the lens is inputted to the mold in which a depth of the edge portion cavity 21a is 400 μm, bubbles are generated in the edge portion cavity 21a because of an excessively great depth.

Therefore, when a depth of the edge portion cavity 21a exceeds 300 μm, formability and bondability of the lens may deteriorate.

Figure 5:
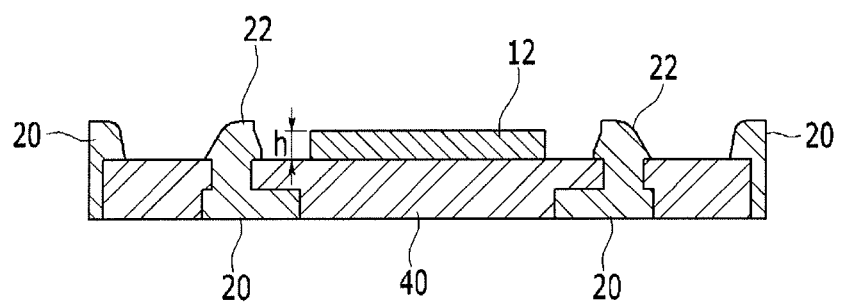
FIG. 5 is a view schematically illustrating a design state of a dam height of the light emitting diode package according to the present exemplary embodiment.
Figure 6:
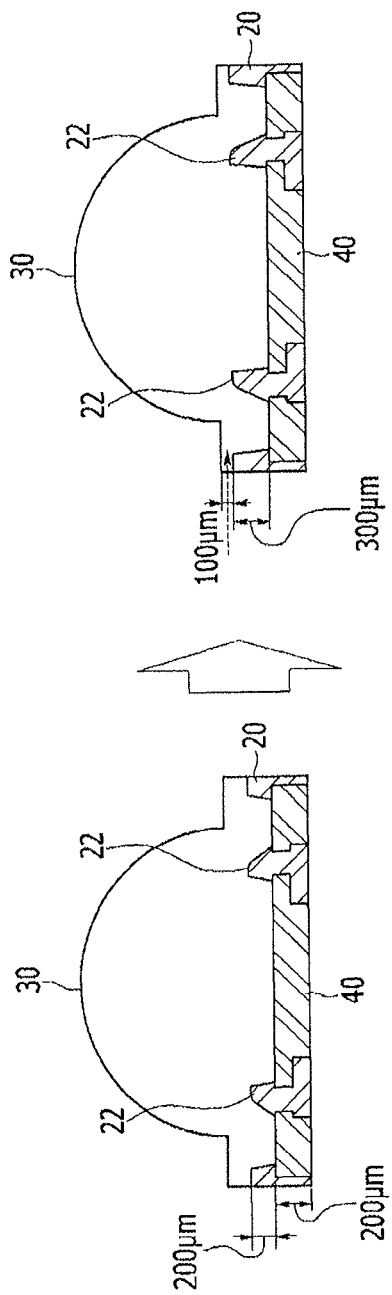
FIG. 6 is a view schematically illustrating a defect in accordance with a dam height of the light emitting diode package according to the present exemplary embodiment.
Figure 7:
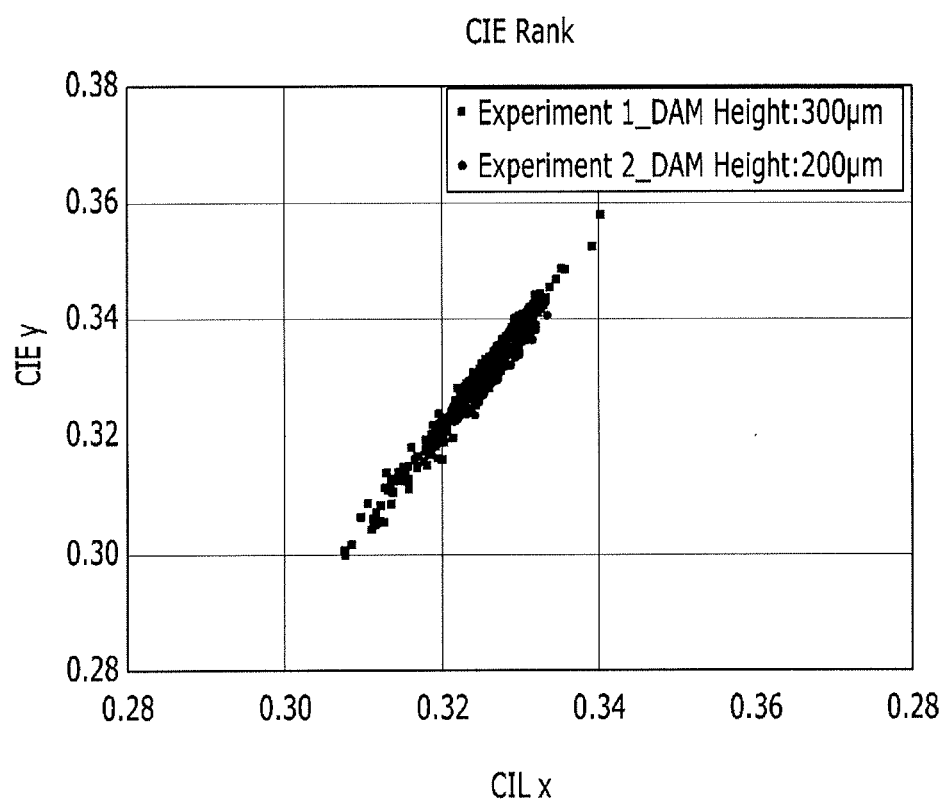
FIG. 7 is a graph illustrating a relationship between a dam height and color distribution of a light emitting diode according to the present exemplary embodiment.

FIG. 5 is a view schematically illustrating a design state of a dam height of the light emitting diode package according to the present exemplary embodiment. FIG. 6 is a view schematically illustrating a defect in accordance with a dam height of the light emitting diode package according to the present exemplary embodiment. FIG. 7 is a graph illustrating a relationship between a dam height and color distribution of a light emitting diode according to the present exemplary embodiment.

As illustrated in FIG. 5 and FIG. 6, a height d of the dam 22, which forms the cavity 21 in the mold 20, is designed to be 100 to 300 μm.

In addition, a product having a height h of 50 to 200 μm is used as a blue chip 12 among the LED chips 10 attached to the substrate 40. The mold 20 is designed and manufactured considering that a height of the blue chip 12 becomes greater than a height of the dam 22.

Here, the reason why the height d of the dam 22 is designed to be 100 to 300 μm will be described below.

As illustrated in FIG. 6, when a height of the dam 22 exceeds 300 μm, a thickness of the resin of the lens bonded to the mold 20 is decreased. Therefore, a defect of formability may occur when forming the lens 30.

In contrast, when a height of the dam 22 is smaller than 100 μm, a depth of the cavity is small as much as the height of the dam 22, and as a result, adhesive strength between the mold 20 and the lens 30 may deteriorate. The present is the same reason that adhesive strength deteriorates when a depth of the edge portion cavity 21a is 50 μm.

Meanwhile it is possible to optimize a height of the dam 22 to 200 μm by verifying optical properties of the LED in accordance with a difference in height of the dam 22.

FIG. 7 illustrates a result of verifying and evaluating coordinate dispersion among electrical properties of the LED based on Experiment 1 in which a dam height is 50 μm and Experiment 2 in which a dam height is 200 μm.

In addition, according to Table 2, LED CIE x, y dispersion may be decreased in a case in which a dam height of 200 μm or greater is applied, and as a result, a dam height of 200 μm may be optimum design.

TABLE 2

| Comparative Product | Experiment 1_DAM Height 50 μm | | Experiment 2_DAM Height 200 μm | |
|---|---|---|---|---|
| Item | CIE x | CIE y | CIE x | CIE y |
| Minimum | 0.3079 | 0.2996 | 0.3213 | 0.3224 |
| Average | 0.3245 | 0.3290 | 0.3278 | 0.3338 |
| Maximum | 0.3404 | 0.3579 | 0.3336 | 0.3435 |
| Δ(Max − Min) | 0.0325 | 0.0583 | 0.0123 | 0.0211 |

Table 2 shows the numerical conversion of a result of verifying an LED coordinate dispersion in accordance with a dam height in FIG. 7. As shown in Table 2, it can be seen that the coordinate dispersion is better when a dam height is 200 μm than when a dam height is 50 μm.

The coordinate dispersion, among the electrical properties of the LED, is better when a difference between a maximum value and a minimum value is small. The better the coordinate dispersion, the higher the mass production of the LED.

Therefore, a deviation of colors when creating white color may be reduced by applying a fluorescent film onto the blue chip 12 by optimizing a height of the dam 22 as described above. Therefore, the mass production of the LED having white color may be effectively performed.

Therefore, an optimum height of the dam 22 is an important design factor for implementing the light emitting diode package. It is possible to control properties of the LED to satisfy a required quality level through the height of the dam 22 when the light emitting diode package is applied to the lamp for a vehicle.

FIGS. 8 to 13 are views schematically illustrating various cavity structures of the light emitting diode package according to the present exemplary embodiment.

The external peripheral cavity 21A is formed in a geometric shape including a circular shape, a square shape, and a rhombic shape.

With the cavity 21 having the geometric shape, it is possible to prevent deformation caused by warping of the molded epoxy and destruction of the product.

Therefore, it is possible to improve bonding strength between the lens 30 and the substrate 40 by forming the cavity 21 in the substrate 40.

Figure 8:
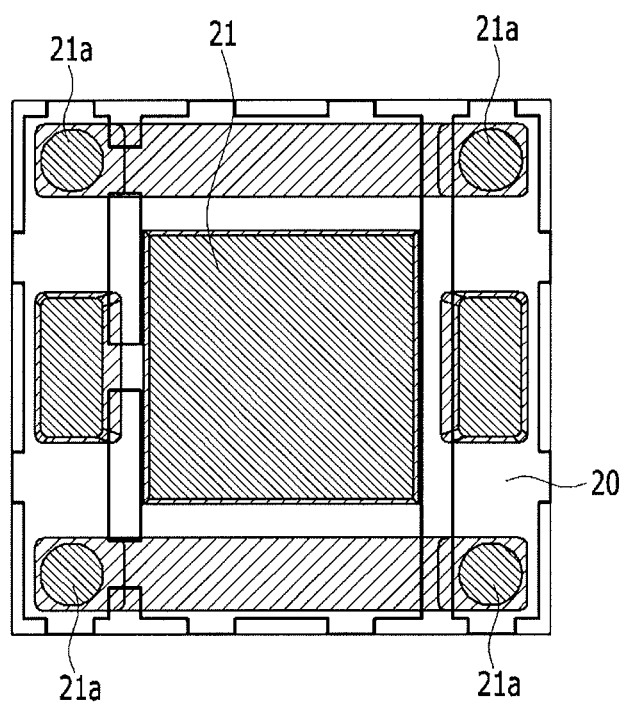
FIG. 8 is a view schematically illustrating a first cavity structure of the light emitting diode package according to the present exemplary embodiment.

For example, in FIG. 8, the edge portion cavity 21a may have a square shape, and an internal of the edge portion cavity 21a may be formed in a circular shape having a predetermined depth.

Figure 9:
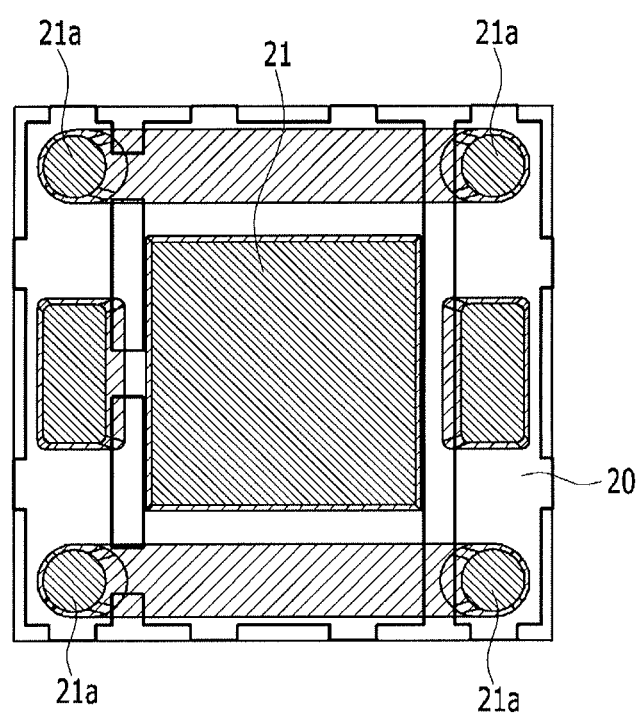
FIG. 9 is a view schematically illustrating a second cavity structure of the light emitting diode package according to the present exemplary embodiment.

In FIG. 9, the edge portion cavity 21a has a circular shape, and the inclined surface 26 formed at one side of the edge portion cavity 21a also has a circular shape.

Figure 10:
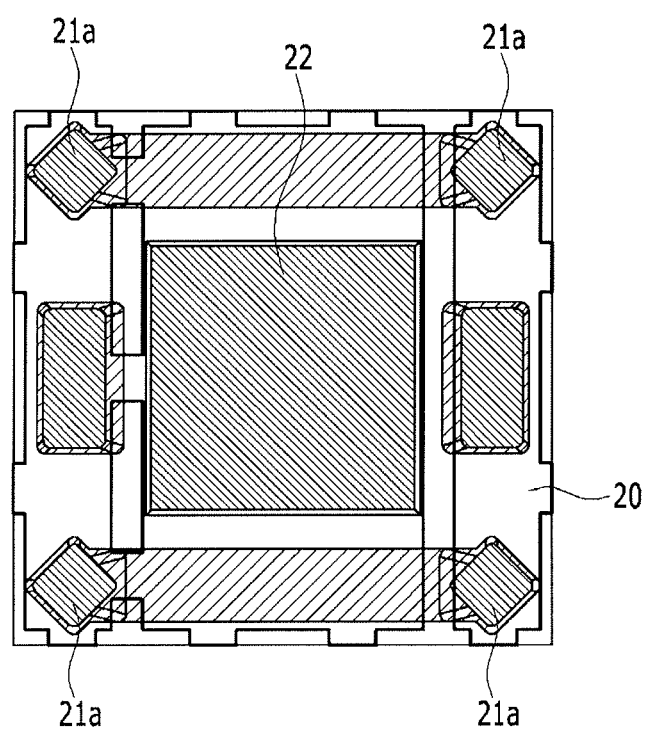
FIG. 10 is a view schematically illustrating a third cavity structure of the light emitting diode package according to the present exemplary embodiment.

In FIG. 10, the edge portion cavity 21a has a structure having a rhombic shape.

Figure 11:
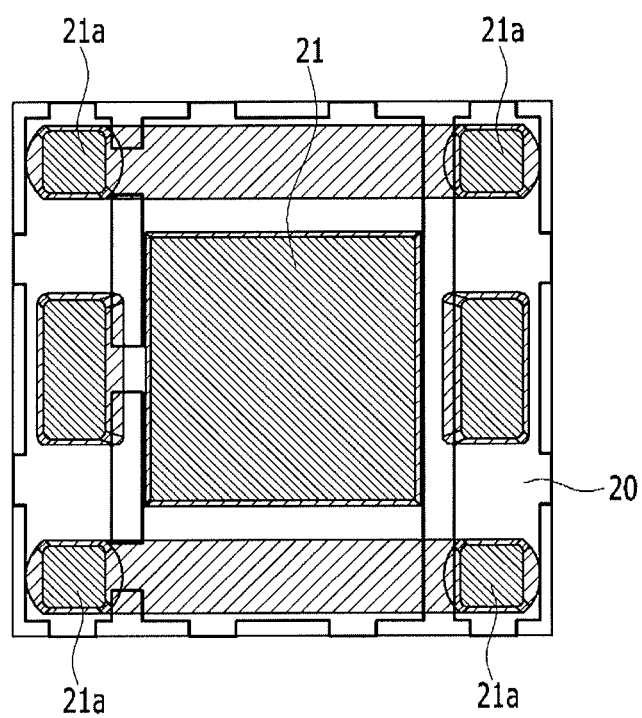
FIG. 11 is a view schematically illustrating a fourth cavity structure of the light emitting diode package according to the present exemplary embodiment.

In FIG. 11, the edge portion cavity 21a may have an elliptical shape, and an internal of the edge portion cavity 21a may be formed in a square shape having a predetermined depth.

Figure 12:
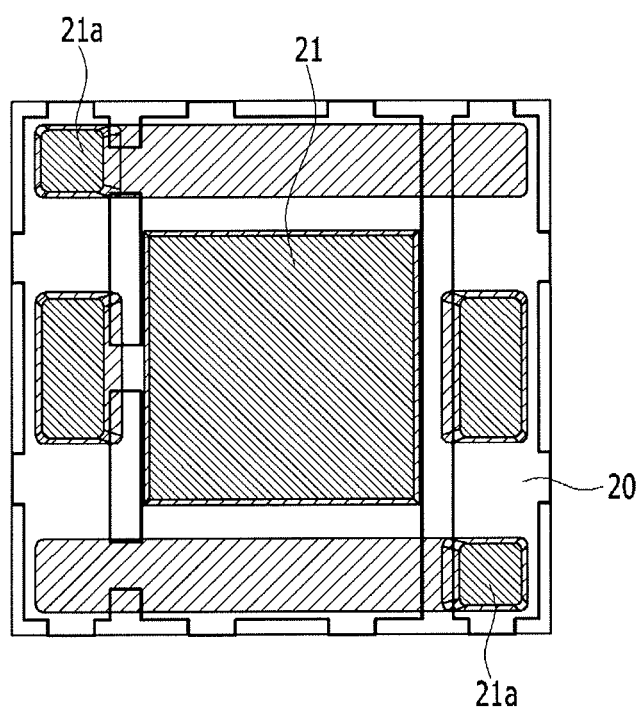
FIG. 12 is a view schematically illustrating a fifth cavity structure of the light emitting diode package according to the present exemplary embodiment.

In FIG. 12, the edge cavities 21a may be formed in a diagonal direction thereof.

Figure 13:
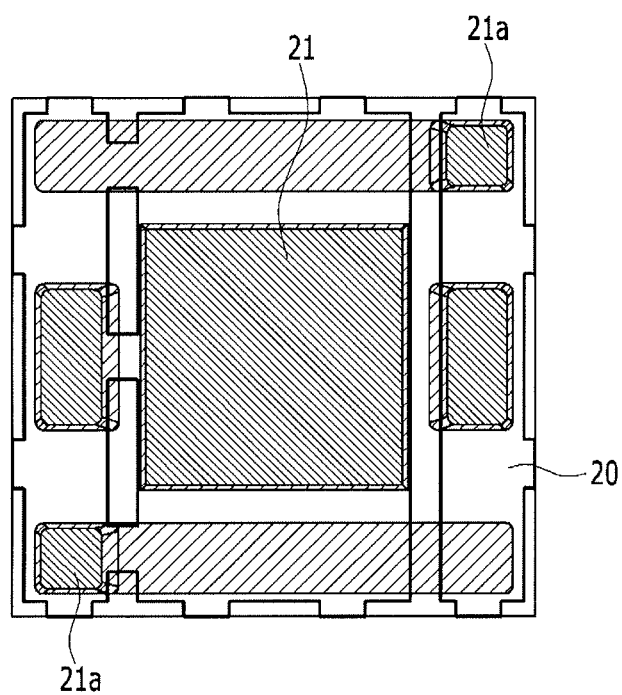
FIG. 13 is a view schematically illustrating a sixth cavity structure of the light emitting diode package according to the present exemplary embodiment.

In FIG. 13, the edge cavities 21a may be formed in a diagonal direction opposite to the direction in FIG. 12.

Therefore, shapes and structures of the edge cavities 21a formed at the four edge portions of the mold 20 or shapes and structures of the external peripheral cavities 21A including the edge cavities 21a may be variously implemented in geometric shapes.

Therefore, it is possible to ensure a highly reliable quality level that satisfies a quality requirement by improving performance of the light emitting diode package used for an external lamp for a vehicle. The bonding area is increased by forming the cavity in a restrictive space of the light emitting diode package, improving bonding quality between the lens and the substrate. It is possible to produce a product with excellent thermal stability and improved durability by improving a material of the substrate of the light emitting diode package.

For convenience in explanation and accurate definition in the appended claims, the terms "upper", "lower", "internal", "outer", "up", "down", "upper", "lower", "upwards", "downwards", "front", "rear", "back", "inside", "outside", "inwardly", "outwardly", "internal", "external", "internal", "outer", "forwards", and "backwards" are used to describe features of the exemplary embodiments with predetermined to the positions of such features as displayed in the figures.

The foregoing descriptions of specific exemplary embodiments of the present invention have been presented for purposes of illustration and description. They are not intended to be exhaustive or to limit the invention to the precise forms disclosed, and obviously many modifications and variations are possible in light of the above teachings. The exemplary embodiments were chosen and described to explain certain principles of the invention and their practical application, to enable others skilled in the art to make and utilize various exemplary embodiments of the present invention, as well as various alternatives and modifications thereof. It is intended that the scope of the invention be defined by the Claims appended hereto and their equivalents.

What is claimed is:

1. An external light emitting diode package for a vehicle, including:
    an LED chip;
    a lead frame which has a substrate which includes conductive metal material and to which one or more LED chips are bonded, and a lead pad which is distanced from the substrate and electrically connected to the LED chip;
    a mold which is formed on the lead frame and includes a dam that forms a cavity in a region of the substrate where the LED chip is bonded; and
    a lens which is bonded to the mold,
    wherein the mold has edge portion cavities and an assembly groove which is formed in a space between the edge portion cavities.

2. The external light emitting diode package of claim 1, wherein
    the mold is formed by an injection molding process using a non-conductive epoxy mold compound.

3. The external light emitting diode package of claim 1, wherein
    the substrate and the mold are bonded to each other while forming a stepped portion.

4. The external light emitting diode package of claim 3, wherein
    the stepped portion is formed at a portion of the substrate which is bonded to the mold.

5. The external light emitting diode package of claim 4, wherein
    the stepped portion of the substrate is formed by one of etching and stamping processes.

6. The external light emitting diode package of claim 4, wherein
    the mold has a catching projection which is formed at a bonding portion with the substrate and abuts against the stepped portion of the substrate.

7. The external light emitting diode package of claim 1, wherein
    the conductive metal material is copper or aluminum.

8. The external light emitting diode package of claim 1, wherein
    a height of the dam is 100 to 300 µm.

9. The external light emitting diode package of claim 1, wherein
    the mold further includes one or more external peripheral cavities which are formed to be depressed along a periphery of the cavity.

10. The external light emitting diode package of claim 9, wherein
    the external peripheral cavities further include the edge portion cavities which are formed to be depressed at one or more edge portions among external peripheral edge portions based on the LED chip.

11. The external light emitting diode package of claim 10, wherein
    the external peripheral cavities further include lateral cavities which are formed to be depressed at one or more lateral sides along the lateral sides based on the LED chip.

12. The external light emitting diode package of claim 10, wherein
an inclined surface is formed at one side of the external peripheral cavity.

13. The external light emitting diode package of claim 9, wherein
a fluorescent film is applied to a portion of the substrate to which the LED chip is attached.

14. The external light emitting diode package of claim 9, wherein
a depth of the external peripheral cavity is 100 to 300 µm.

15. The external light emitting diode package of claim 9, wherein
the external peripheral cavity is formed in a geometric shape including a circular shape, a square shape, or a rhombic shape.

* * * * *